(12) United States Patent  
Ostermöller

(10) Patent No.: US 9,329,236 B2  
(45) Date of Patent: *May 3, 2016

(54) DEVICE AND METHOD FOR MONITORING AN INTEGRITY OF A SERIES-CONNECTION OF A PLURALITY OF SWITCHES

(71) Applicant: VERIFONE GMBH, Bad Hersfeld (DE)

(72) Inventor: Michael Ostermöller, Bad Hersfeld (DE)

(73) Assignee: VeriFone GmbH (DE)

( * ) Notice: Subject to any disclaimer, the term of this patent is extended or adjusted under 35 U.S.C. 154(b) by 450 days.

This patent is subject to a terminal disclaimer.

(21) Appl. No.: 13/893,022

(22) Filed: May 13, 2013

(65) Prior Publication Data

US 2013/0271147 A1 Oct. 17, 2013

Related U.S. Application Data

(63) Continuation of application No. 12/745,485, filed as application No. PCT/EP2008/066335 on Nov. 27, 2008, now Pat. No. 8,461,990.

(30) Foreign Application Priority Data

Nov. 29, 2007 (DE) .......................... 10 2007 057 477

(51) Int. Cl.  
*G01R 31/327* (2006.01)  
*G08B 13/14* (2006.01)

(52) U.S. Cl.  
CPC ............ *G01R 31/327* (2013.01); *G08B 13/149* (2013.01)

(58) Field of Classification Search  
CPC ............................ G01R 31/327; G08B 13/149  
USPC ........ 340/541, 514, 531, 533, 657; 902/8–10, 902/22, 30, 31, 38; 335/2, 106, 127, 128, 335/78; 307/113, 116, 119, 328  
See application file for complete search history.

(56) References Cited

U.S. PATENT DOCUMENTS

| | | | |
|---|---|---|---|
| 4,310,835 A * | 1/1982 | Sefton | ............................ 340/533 |
| 6,279,825 B1 | 8/2001 | Yokoyama | |
| 6,921,988 B2 | 7/2005 | Moree | |
| 6,963,281 B2 * | 11/2005 | Buckley | ........................ 340/547 |

FOREIGN PATENT DOCUMENTS

| | | |
|---|---|---|
| DE | 2 241 738 | 3/1973 |
| DE | 601 01 096 T2 | 7/2004 |

(Continued)

*Primary Examiner* — James Yang  
*Assistant Examiner* — Laura Nguyen  
(74) *Attorney, Agent, or Firm* — Mannava & Kang, P.C.

(57) ABSTRACT

A device for monitoring a space by changing a sequence of a serial interconnection of closing contacts, in particular of cover switches in a security housing, having a series circuit variation apparatus, a security cover, at least two closing contacts, and a protective circuit, wherein said at least two closing contacts each have an open, electrically nonconductive state and a closed, electrically conductive state, wherein said security cover is set up to put each of said at least two closing contacts in a closed, electrically conductive state, wherein said protective circuit is set up to detect an opening of at least one of said at least two closing contacts, wherein said series circuit variation apparatus serially interconnects said at least two closing contacts, wherein the sequence of the serial interconnection of said at least two closing contacts can be changed by said series circuit variation apparatus.

15 Claims, 4 Drawing Sheets

(56) References Cited

FOREIGN PATENT DOCUMENTS

| | | | |
|---|---|---|---|
| EP | 0 142 013 | A2 | 5/1985 |
| EP | 0 558 222 | A1 | 9/1993 |
| FR | 2 596 176 | A1 | 9/1987 |
| GB | 1 369 739 | | 10/1974 |
| WO | WO 01/63994 | A2 | 8/2001 |

* cited by examiner

DEVICE AND METHOD FOR MONITORING AN INTEGRITY OF A SERIES-CONNECTION OF A PLURALITY OF SWITCHES

CROSS REFERENCE TO RELATED APPLICATIONS

This application is a continuation of co-pending application Ser. No. 12/745,485 filed on Sep. 9, 2010, which is a National Phase of International Application No. PCT/EP2008/066335 filed on Nov. 27, 2008, which claims the benefit of the filing date of German Patent Application No. 10 2007 057 477.2 filed on Nov. 29, 2007. The entire contents of all of the above applications are hereby incorporated herein by reference.

The invention relates to a device and method for monitoring integrity of a series-connection of a plurality of switches as applied, e.g. for monitoring a space, by series-connected normally-open contacts, a method for monitoring a space by series-connected normally-open contacts, and the use of a device for monitoring a space by series-connected normally-open contacts to safeguard a terminal for electronic payment transactions.

Terminals for electronic payment transactions are often covered and hence protected by a mechanical security cover, for example in the form of a dimensionally stable cover. The security cover shifts a plurality of normally-open contacts, which are also referred to as cover interlock switches or enclosure switches, into a closed, electrically conducting state, and keeps said contacts in this state.

Today's systems usually contain two to three of these normally-open contacts, which are connected in series. A deployed pull-down resistor, for example, is used here to detect the opening of a normally-open contact.

Security requirements are growing in the face of increasing attacks on terminals or their keyboards. For normally-open contacts lying in series, it may be sufficient to connect the start point of the series circuit to the end point, or to apply an external level to the end point, in order to disable detection of the normally-open contact state of the normally-open contacts. Hence for three normally-open contacts, it may be sufficient to attack just one or two points instead of six.

In another conventional embodiment, the normally-open contacts may be fed in parallel to a multiple logic gate, whereby the output only outputs an "OK" signal when all the normally-open contacts in the parallel branches are closed. This increases the power consumption of the sensor circuitry, which in turn reduces the lifetime, for instance, of a battery used for the power supply.

SUMMARY OF THE INVENTION

It is an object of the invention to provide a device and a method for monitoring a space, said device and method having enhanced security features and hence increased security.

This object may be achieved by a device for monitoring a space by varying a sequence of a series connection of normally-open contacts, by a method for varying a sequence of a series connection of normally-open contacts, and by the use of a device for monitoring a space by varying a sequence of a series connection of normally-open contacts to safeguard a terminal for electronic payment transactions, having the features of the independent claims.

According to an exemplary embodiment of the present invention, a device is provided for monitoring a space by varying a sequence of a series connection of normally-open contacts, in particular of cover interlock switches in a security enclosure, said device comprising a series-connection variation device, a security cover, at least two normally-open contacts and a protective circuit, said at least two normally-open contacts each having an open, electrically non-conducting state and a closed, electrically conducting state, said security cover being configured to shift each of the at least two normally-open contacts into a closed, electrically-conducting state in each case, said protective circuit being configured to detect an opening of at least one of the at least two normally-open contacts, said series-connection variation device connecting in series the at least two normally-open contacts, it being possible to vary the sequence of the series connection of the at least two normally-open contacts by the series-connection variation device.

According to a further exemplary embodiment of the present invention, a method is provided for varying a sequence of a series connection of normally-open contacts, said method comprising the steps of series connecting of at least two normally-open contacts using a series-connection variation device, of varying the sequence of the series connection of at least two normally-open contacts using the series-connection variation device, of closing each of the at least two normally-open contacts in an electrically conducting state using a security cover and of detecting the closure status of each of the at least two normally-open contacts using a protective circuit.

According to a further exemplary embodiment of the present invention, the device for monitoring a space by varying a sequence of a series connection of normally-open contacts is used to safeguard a terminal for electronic payment transactions.

The following definitions are used in the present patent application.

series-connection variation device:

In the context of the present invention, a series-connection variation device may be understood to mean any facility for connecting together in series a plurality of components, in particular at least two normally-open contacts, so that they lie in series, i.e. one after the other, as regards a possible current flow or logic flow. In addition, the series-connection variation device may be configured to vary the sequence, i.e. the order, of the components. This may be done, for example, by simply switching over conductor paths or by a more complex logic circuit or the like. Reversing the polarity, in other words reversing the current flow or logic flow in at least one element, may also be realised here.

security cover:

In the context of the present invention, a security cover may be understood to mean any cover that is suitable, owing to its geometric, mechanical and/or electrical design, to hinder or prevent access to an electronic circuit lying e.g. beneath or behind it, or at least to detect or provide means to detect such access. The security cover may here, for example, prevent access mechanically purely as a result of the material chosen for it (impact-proof plastic, metal etc.), or enable access to be detected by using a suitable design, for instance by using inserted or applied conductor paths, wires or the like. Of course, it is also possible to combine detection and protection.

protective circuit:

In the context of the present invention, a protective circuit may be understood to mean any means that are suitable to detect an opening of normally-open contacts or even (not dealt with in further detail in the following description) a closure of normally-open contacts (a combination of the two is possible), to evaluate said opening or closing and/or subsequently to initiate further actions, such as triggering an alarm and/or sending a signal to other components or elements.

According to an exemplary embodiment of the present invention, by way of illustration, a device is provided for monitoring a space, in particular for monitoring cover interlock switches in a security enclosure, for example to safeguard a terminal for electronic payment transactions, said device having enhanced security features.

The device according to the invention may be used, for example, on Point of Sales (POS) pin pads, or also on suitable pin pads in automatic teller machines.

In this case, electronic circuitry that is disposed in a space to be monitored and e.g. stores and/or processes critical data may be protected from unauthorized access by a security cover.

The security cover here may cover the space to be protected and may also actuat at least one normally-open contact, although preferably two normally-open contacts.

The closure status of the normally-open contacts may in turn be monitored by a protective circuit, which may detect if at least one of the normally-open contacts is opened.

Safeguarding the electronic circuitry by the security cover may be an effective means of detecting and/or preventing direct access to the electronic circuitry underneath it.

In this case, as an alternative to a parallel connection of the normally-open contacts, a series connection of the normally-open contacts may be used, it being possible to vary said series connection in a controlled manner, in order to increase the protection of the device against tampering attempts or removal of the security cover.

The sequence of the normally-open contacts may be varied cyclically here, so that a potential attacker may be unable to identify and attack the start and end of the series circuit.

The cyclical variation of the sequence of the series connection of normally-open contacts according to the present invention may also be understood to mean a defined, repeating variation of the end point of the series circuit, i.e. the sequence of the series connection of the normally-open contacts.

This cyclical variation of the sequence may mean that it may no longer be sufficient for a potential attacker to attack or to bridge just one point, namely the end point, for instance, or even just two points, the start and end point, because it may be possible to detect this attack when the sequence of the series connection of normally-open contacts is varied cyclically, owing to the fact that the start and end points of the series circuit may vary over time.

In fact for a tamper attempt it may be now necessary to bridge every single normally-open contact on its own, which would significantly increase the complexity of such an attack.

In addition, a random variation of the sequence of the series connection of normally-open contacts may be possible.

It therefore provides an effective means of preventing a Personal Identification Number (PIN) being obtained by spying, for example. As a possible response to detecting a removal of the security cover or even just the attempt to remove it, the protective circuit may initiate further actions, which include, for example, triggering an alarm or else the immediate erasure of program elements stored in electronic components, in order thereby to render unusable a card reader, pin pad and/or terminal for electronic payment transactions and, for example, to call for servicing.

Further exemplary embodiments follow from the dependent claims.

Exemplary embodiments of the device according to the invention for monitoring a space by varying a sequence of a series connection of normally-open contacts are described below. Features of the described embodiments also apply analogously, however, to the method for varying a sequence of a series connection of normally-open contacts, and to the use of a device for monitoring a space by varying a sequence of a series connection of normally-open contacts to safeguard a terminal for electronic payment transactions.

According to a further exemplary embodiment of the present invention, the device according to the invention also has a printed circuit board, said printed circuit board having a protected area disposed under the security cover, where at least one of the elements of the group comprising series-connection variation device, normally-open contact and protective-circuit components is arranged in the protected area.

A simple and low-cost option for the design and build of the device according to the invention may be provided by the design of the device with a printed circuit board. A protected area may be understood below to mean an area that may be protected from external access by enhanced measures, or it may be possible to detect an unauthorized external access. Such a security cover may constitute purely mechanical protection, for example by making it out of metal, hard plastic or impact-proof plastic, or may include enhanced measures such as applying or inserting conductor paths or wires into the security cover, which may be disconnected or severed by unauthorized external access and hence enable detection of the unauthorized access.

According to a further exemplary embodiment of the present invention, the sequence of the series connection of the at least two normally-open contacts can be varied cyclically by the series-connection variation device.

A simple and, in particular, simple-to-detect cyclic progression, i.e. a sequence that repeats in a defined way, in the variation of the sequence of the series connection of the at least two normally-open contacts may be implemented in this way. Such a cyclical variation may be implemented simply, and, in particular, may be realised by a simple embodiment of the variation specification.

In addition, by a corresponding cyclical realisation, a simple implementation of the variation of the sequence may be achieved, for example, by simple look-up tables.

According to a further exemplary embodiment of the present invention, the sequence of the series connection of the at least two normally-open contacts can be varied in defined time intervals, in particular less than 1 millisecond, in addition in particular less than 200 microseconds.

Such an embodiment of the time intervals may particularly hinder a potential attacker in starting an attack, in particular actually in responding to a corresponding variation of the sequence, and hence may significantly additionally increase the security of the present invention.

According to a further exemplary embodiment of the present invention, the normally-open contacts are designed as an element of the group comprising switching element, switch, momentary-contact element or push-button, momentary-contact switch, dip-fix switch element and carbon-contact dome having associated contacts.

Using such an element as a normally-open contact may enable the normally-open contacts to be closed in a simple manner that is not prone to errors, and hence may be effective in reducing the risk of false alarms. In addition, a simple and low-cost design of the device according to the invention may be possible using such elements.

According to a further exemplary embodiment of the present invention, the series-connection variation device comprises a microprocessor and a multiplexer/demultiplexer element, where the multiplexer/demultiplexer element may be controlled by the microprocessor.

The embodiment of the series-connection variation device as a combination of microprocessor and multiplexer/demultiplexer element may enable the series connection and the variation of the sequence of the series connection of the normally-open contacts to be implemented simply. By controlling the multiplexer/demultiplexer element by the microprocessor, the series connection and the variation of the sequence of the series connection may be performed substantially by or in the multiplexer/demultiplexer element.

According to a further exemplary embodiment of the present invention, the device also comprises an analogue switch element, where the analogue switch element may be controlled using the same control signals from the microprocessor as are used for controlling the multiplexer/demultiplexer element, and where the sequence of the series connection of the at least two normally-open contacts may be varied using the multiplexer/demultiplexer element and the analogue element.

Such an enhancement of the connection of the at least two normally-open contacts may enable a simple enhancement in the connection sequence and also additionally may hinder a potential attack. Overall, the integrity of the device according to the invention may be increased by this means.

An identical and parallel control of the multiplexer/demultiplexer element and analogue switch element may mean that the analogue switch element may be integrated simply in a logic table of the device according to the invention.

BRIEF DESCRIPTION OF THE DRAWINGS

Exemplary embodiments of the invention are explained in greater detail below and illustrated in the following figures, in which.

Identical or similar components in different figures are denoted by the same reference signs.

The figures use schematic representations that are not to scale.

DETAILED DESCRIPTION

Figure 1:
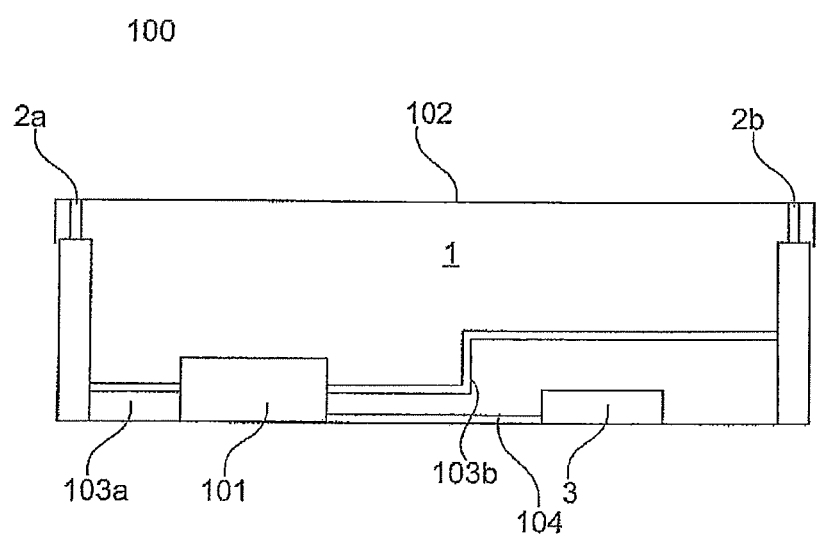
FIG. 1 shows a schematic diagram of an exemplary implementation of a device according to one embodiment of the present invention.

A schematic diagram of an exemplary implementation of a device 100 according to one embodiment of the present invention is described below with reference to FIG. 1.

The device 100 according to the invention has a space or protected area 1 disposed under a security cover 102. When in a closed and hence protected state, the security cover 102 holds the two exemplary normally-open contacts 2a,b in a closed, electrically conducting state. The security cover 102, as already mentioned, may be made of metal, impact-proof plastic or the like and hence mechanically prevent or at least hinder access to the space 1.

Correct placement of the security cover 102 is ensured by the normally-open contacts 2a,b, more precisely by their closed, conducting state.

The series-connection variation device 101 connects the two normally-open contacts 2a,b in series using the sketched signal-line pairs 103a,b, for example conductor paths, cables or the like.

The series-connection variation device 101 now continuously varies internally the series connection of the normally-open contacts 2a,b, for example at an interval of approximately 200 microseconds.

If it is detected that one of the contacts has been opened, i.e. the device has been attacked, then the protective circuit 3 is actuated or triggered via signal line 104, and may subsequently take actions (not described in further detail) to respond adequately to the attack.

An enhanced connection of three normally-open contacts 2a,b,c using multiplexer/demultiplexer elements 4 is described below with reference to FIG. 2.

Figure 2:
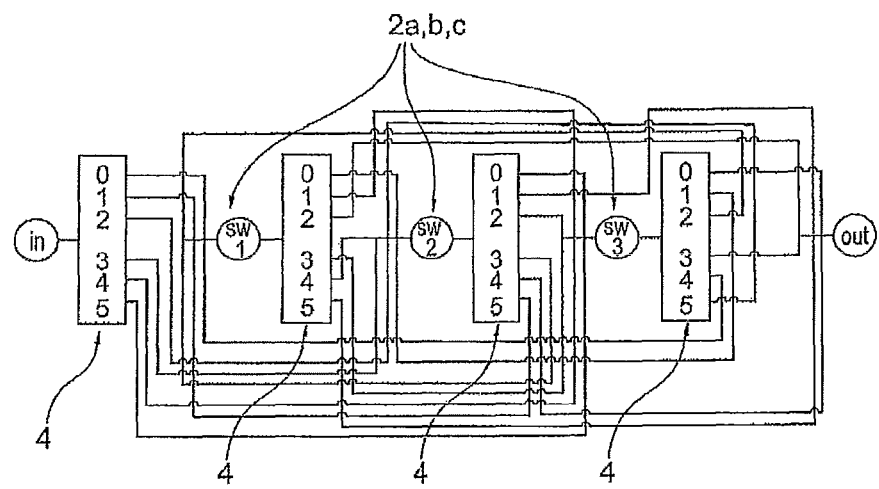
FIG. 2 shows a schematic diagram of an enhanced connection of three normally-open contacts using multiplexer/demultiplexer elements for a device according to one embodiment of the present invention.

The multiplexer/demultiplexer elements 4 in FIG. 2 may be operated in demultiplex mode and may switch the sequence of the three normally-open contacts 2a,b,c as a function of the individual control signals, which may assume the states "0" to "5" as shown.

In the schematic diagram of FIG. 2, a signal may be input to the enhanced connection at the point "in" and may leave it at the point "out". The order or sequence amongst the normally-open contacts 2a,b,c may then be defined subsequently by the control of the multiplexer/demultiplexer elements 4 by their states "0" to "5".

The connections in the states "0" and "4" are described below by way of example.

In control state "0", the signal may be input via "in" to the first multiplexer/demultiplexer element 4. Then it may be output via the output of the first multiplexer/demultiplexer element 4, which is assigned the "0", and may subsequently reach the normally-open contact SW1 2a.

At the second multiplexer/demultiplexer element 4, the signal may in turn be routed via the output assigned to the zero state, and hence may reach the normally-open contact SW2 2b.

At the third multiplexer/demultiplexer element 4, the input may also be switched through to output "0", the signal may arrive at the normally-open contact SW3 2c, and then at the fourth multiplexer/demultiplexer element 4 may be routed again via output "0" to the common output of the connection circuitry shown in FIG. 2.

Hence in control state "0", the connection of the normally-open contacts 2a,b,c may result in SW1-SW2-SW3.

In control state 4 now being described, the respective input of the multiplexer/demultiplexer elements 4 shown in FIG. 2 may be connected through to the respective output 4.

Hence the common input may be taken by the first multiplexer/demultiplexer element 4 to the normally-open contact SW3 2c, and this is in turn routed via output 4 of the fourth multiplexer/demultiplexer element 4 to the normally-open contact SW 1 2a. The connection to normally-open contact SW2 2b may be made via output 4 of the second multiplexer/demultiplexer element 4. In the state being described, output 4 of the third multiplexer/demultiplexer element 4 may then be connected to the common output of the connection shown in FIG. 2, so that a normally-open contact sequence SW3-SW1-SW2 is obtained in control state 4.

The table below shows possible sequences of the normally-open contacts of FIG. 2:

| MUX/DEMUX control signal | Sequence of normally-open contacts |
| --- | --- |
| 0 | SW1 - SW2 - SW3 |
| 1 | SW1 - SW3 - SW2 |
| 2 | SW2 - SW3 - SW1 |
| 3 | SW2 - SW1 - SW3 |
| 4 | SW3 - SW1 - SW2 |
| 5 | SW3 - SW2 - SW1 |

A device for monitoring a space by varying a sequence of a series connection of normally-open contacts results in an increase in security because a successful attack regularly needs to connect the input contact of the first normally-open contact of the series connection of the normally-open contacts to the output contact of the last normally-open contact in order thereby to bridge the entire set of normally-open contacts.

In such a variation of the sequence of the series connection of normally-open contacts, the sequence itself can no longer be identified obviously, which may provide an effective means of preventing an attack of the type just described.

An attack on the output contact of the last normally-open contact, which, for such an attack, may be used so as to apply a level that would take the output constantly to "ok", hence may fail because of the fact that when varying the sequence of the series connection of normally-open contacts, the normally-open contact located last in the sequence also varies continuously.

A connection of three normally-open contacts using multiplexer/demultiplexer elements having reduced interconnections is described below with reference to FIG. 3.

In order to provide an effective means of preventing the two potential attacks described above, it may be sufficient first to vary the sequence of the series connection of the normally-open contacts and second to place each normally-open contact at the end of the series connection once in a cyclic progression. FIG. 3 shows a possible implementation of these two conditions using reduced interconnections.

Figure 3:
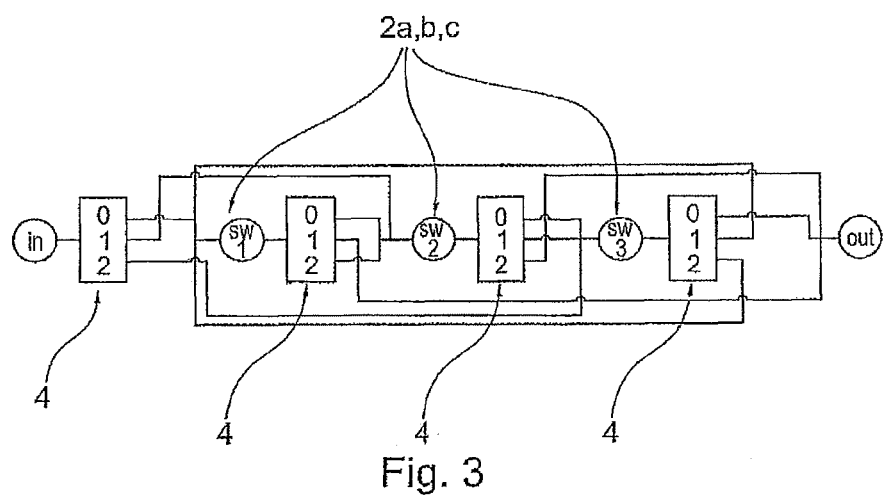
FIG. 3 shows a schematic diagram of a connection of three normally-open contacts using multiplexer/demultiplexer elements having reduced interconnections for a device according to one embodiment of the present invention.

In the implementation shown in FIG. 3, the sequence of the normally-open contacts 2a,b,c may now rather be understood to mean "shifted to the left" in each case, so that each normally-open contact 2a,b,c is applied to the common output of the connection once per cycle.

The table below shows the cyclical connection resulting from FIG. 3:

| MUX/DEMUX control signal | Sequence of normally-open contacts |
| --- | --- |
| 0 | SW1 - SW2 - SW3 |
| 1 | SW2 - SW3 - SW1 |
| 2 | SW3 - SW1 - SW2 |

Such an implementation having reduced interconnections may be an effective means of reducing the design requirements while still meeting the conditions required for increased security.

An exemplary embodiment of the device for monitoring a space by varying a sequence of a series connection of normally-open contacts is described below with reference to FIG. 4.

The components used here are purely by way of example and are not restrictive.

Figure 4:
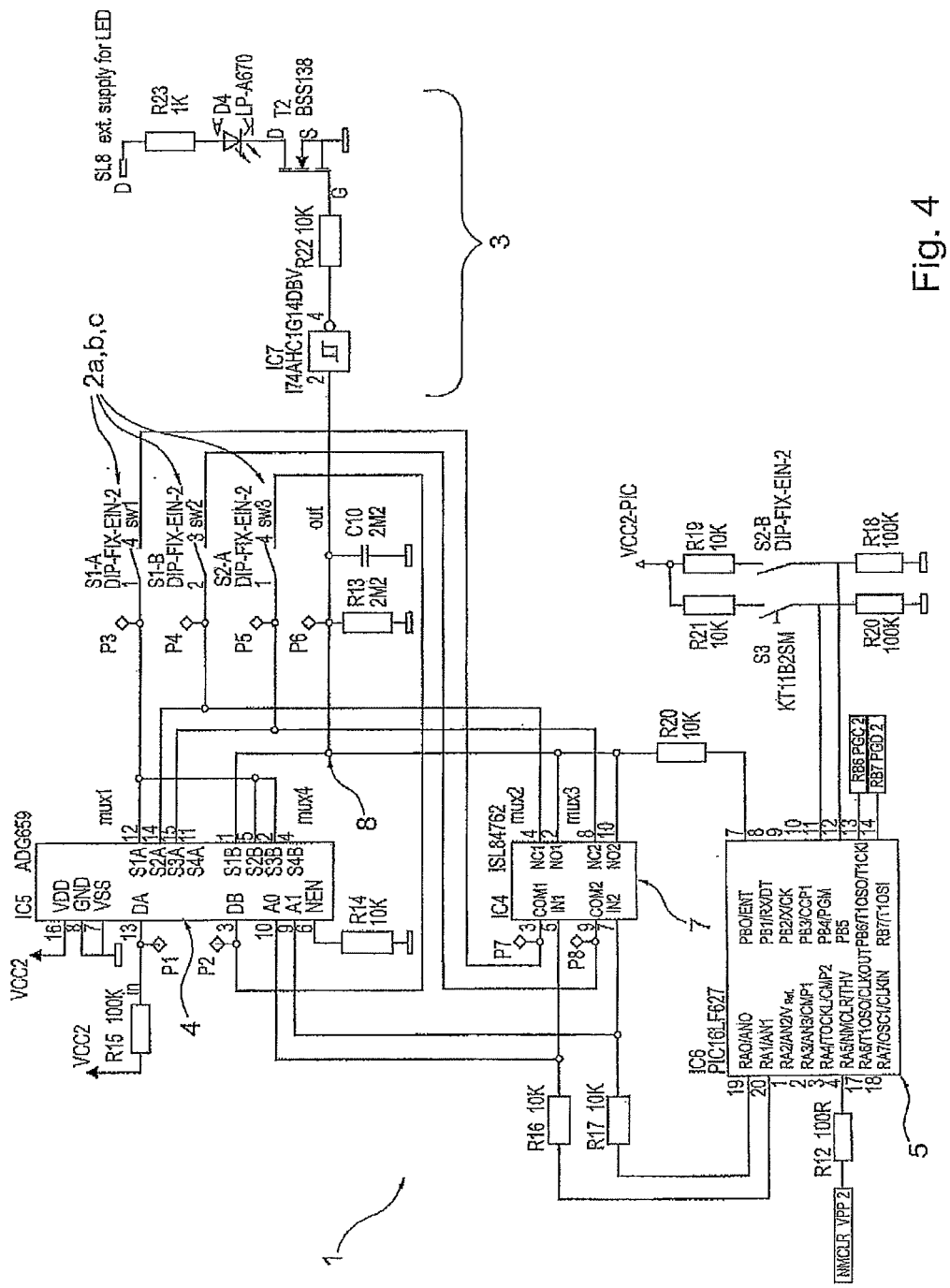
FIG. 4 shows a circuit diagram of an exemplary embodiment of a device according to one embodiment of the present invention.

FIG. 4 shows a device for monitoring a space 1 by varying a sequence of a series connection of normally-open contacts 2a,b,c.

The circuit comprises a multiplexer/demultiplexer element 4, which here is implemented as a dual multiplexer/demultiplexer element by way of example. Hence it comprises two independent multiplexer/demultiplexer element units.

An analogue switch element 7 is also used to implement the connection.

Both the multiplexer/demultiplexer element 4 and the analogue switch element 7 are controlled by the microprocessor 5, and specifically here by its control outputs RA0 and RA1.

The two control outputs are taken via the two resistors R16 and R17 respectively in parallel to the inputs A0 and A1 of the multiplexer/demultiplexer element 4 and IN1 and IN2 of the analogue switch element 7.

Hence multiplexer/demultiplexer element 4 and analogue switch element 7 are controlled in parallel. The output signal 8 of the device for monitoring a space by varying a sequence of a series connection of normally-open contacts is taken in parallel to the protective circuit 3 and is simultaneously sent via resistor R24 to the microprocessor via its input RB0.

On detecting an unauthorized external access, for example by disconnection of at least one normally-open contact, the microprocessor (via RB0) and/or the protective circuit detect this and initiate further actions, such as emitting an alarm or erasing at least portions of the firmware of the device and hence putting the device into an unusable state.

The three normally-open contacts 2a,b,c, which are shown here as S1-A, S1-B and S2-A, are varied in sequence cyclically in accordance with the diagram and specification represented in FIG. 3.

It therefore results in the connection shown below:

| MUX/DEMUX control signal | Sequence of normally-open contacts |
| --- | --- |
| 0 | S1-A - S1-B - S2-A |
| 1 | S1-B - S2-A - S1-A |
| 2 | S2-A - S1-A - S1-B |

A schematic diagram of a device for safeguarding a terminal for electronic payment transactions according to the prior art is described below with reference to FIG. 5.

Figure 5:
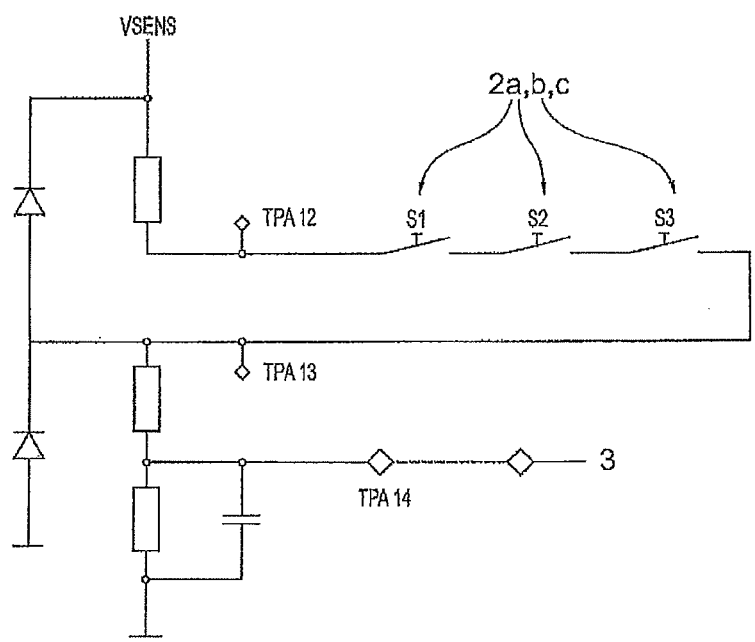
FIG. 5 shows a schematic diagram of a device according to the prior art for safeguarding a terminal for electronic payment transactions.

FIG. 5 shows the series connection of the three normally-open contacts S1 to S3, 2a,b,c.

If each of the three normally-open contacts 2a,b,c is in a closed state, then the circuit of FIG. 5 may exhibit at the point TPA 14 a value that corresponds to the protected, normal state, for example a logic "1".

Alternatively, if just one normally-open contact 2a,b,c is open, point TPA 14 may exhibit a value that corresponds to an attacked state, for example a logic "0", and hence to a fault state.

A protective circuit 3 (not shown in greater detail in FIG. 5), which may also be connected to the point TPA 14 for example, using the respective logic state "0" or "1", may detect the integrity of a security cover, said security cover closing each of the individual normally-open contacts 2a,b,c, and hence connecting them in an electrically conducting manner, when in the protected state.

If, as a result of an attack, just one of the three normally-open contacts 2a,b,c is disconnected, then the logic value at point TPA 14 may change from normal state "1" to fault state "0". The protective circuit may detect this change and initiate further actions.

As FIG. 5 shows, an attack on the device according to the prior art may be possible by simply connecting/shorting together the points TPA 12 and TPA 13 shown in the figure. An attack may equally be possible by simply applying a suitable signal to the point TPA 13 in order to hold the point TPA 14 continuously in the "1" state.

An attack of this type need not necessarily be made on at least one of the points TPA 12, TPA 13, TPA 14, but may also be made on the normally-open contacts themselves.

The invention is not restricted in its implementation to the preferred embodiments shown in the figures. In fact a multiplicity of variants are possible that make use of the presented solution and principle according to the invention, even in fundamentally different embodiments.

The description of the present invention consistently refers to detecting the opening of a normally-open contact. The use of equivalent implementations, in which normally-open contacts are closed in the event of an attack, is equally possible, however, as is a combination of the two variants.

For the sake of completeness, it should be mentioned that the terms "having" and "comprising" do not exclude other elements or steps, and "a" does not exclude a multiplicity. In addition, it should be mentioned that features or steps, which have been described with reference to one of the above exemplary embodiments, can also be used in combination with other features or steps of other exemplary embodiments described above. Reference signs in the claims shall not be considered as restrictive.

LIST OF REFERENCES 1 space, protected area
2a,b,c normally-open contacts
3 protective circuit
4 multiplexer/demultiplexer element
5 microprocessor
6 analogue switch element
7 common output of the device for monitoring a space by varying a sequence of a
series connection of normally-open contacts
100 device for monitoring a space by varying a sequence of a series connection of
normally-open contacts
101 series-connection variation device
102 protective cover
103a,b signal-line pairs
104 signal line

The invention claimed is:

1. A monitoring device for monitoring integrity of a series-connection of a plurality of switches, the monitoring device comprising:
    a protective circuit adapted to detect a switching status of at least one of a plurality of series connected switches for monitoring the integrity of the series-connection of the plurality of switches; and
    a series-connection variation device, the series-connection device including:
        at least one multiplexer/demultiplexer element adapted to vary the sequence of the series connection of the plurality of switches; and
        a microprocessor adapted to control the at least one multiplexer/demultiplexer element.

2. The device of claim 1, wherein the at least one multiplexer/demultiplexer element includes a plurality of outputs such that there is at least one output for each of the plurality of switches connected in series; and
    wherein the microprocessor is further adapted to control the output of the at least one multiplexer/demultiplexer element to vary the sequence of the plurality of the series-connected switches.

3. The device of claim 1, wherein the microprocessor is configured to vary the sequence of the series-connection of the plurality of switches cyclically.

4. The device of claim 1, wherein the microprocessor is configured to vary the sequence of the series-connection of the plurality of switches in predefined time intervals.

5. The device of claim 4, wherein the time interval is less than 1 millisecond.

6. The device of claim 4, wherein the time interval is less than 200 microseconds.

7. The device of claim 1, further comprising an analogue switch element controlled by the microprocessor using the same control signals as are used for controlling the at least one multiplexer/demultiplexer element.

8. A method for monitoring integrity of a series-connection of a plurality of switches, the method comprising the steps of:
    connecting the plurality of switches in series using a series-connection variation device including at least one multiplexer/demultiplexer element and a microprocessor;
    varying the sequence of the series-connection of the plurality of switches using the series-connection variation device; and
    detecting a switching status of at least one of the plurality of series connected switches to monitor the integrity of the series-connection of the plurality of switches.

9. The method according to claim 8, wherein the series-connection of the plurality of switches is varied cyclically.

10. The method according to claim 8, wherein the series-connection of the plurality of switches is varied in predefined time intervals.

11. The method of claim 10, wherein the time interval is less than 1 millisecond.

12. The method of claim 10, wherein the time interval is less than 200 microseconds.

13. The method according to claim 8, wherein the sequence of the series-connection of the plurality of switches is varied using the microprocessor and the multiplexer/demultiplexer element.

14. The method according to claim 13, wherein:
    the sequence of the series connection of the plurality of switches is varied using the multiplexer/demultiplexer element and an analogue switch element; and
    the analogue switch element is controlled using the same control signals from the microprocessor as are used for controlling the multiplexer/demultiplexer element.

15. Use of a device according to claim 1 to safeguard a terminal for electronic payment transactions.

* * * * *